United States Patent
Gambino (10) Patent No.: US 7,666,746 B2
(45) Date of Patent: Feb. 23, 2010

(54) SEMICONDUCTOR TRANSISTORS HAVING HIGH-K GATE DIELECTRIC LAYERS, METAL GATE ELECTRODE REGIONS, AND LOW FRINGING CAPACITANCES

(75) Inventor: Jeffrey Peter Gambino, Westford, VT (US)

(73) Assignee: International Business Machines Corporation, Armonk, NY (US)

(*) Notice: Subject to any disclaimer, the term of this patent is extended or adjusted under 35 U.S.C. 154(b) by 129 days.

(21) Appl. No.: 12/013,514

(22) Filed: Jan. 14, 2008

(65) Prior Publication Data
US 2009/0179284 A1  Jul. 16, 2009

(51) Int. Cl.
*H01L 21/00* (2006.01)
(52) U.S. Cl. .................. 438/287; 438/422; 438/197
(58) Field of Classification Search .............. 438/287, 438/197, 422
See application file for complete search history.

(56) References Cited

U.S. PATENT DOCUMENTS

| | | | |
|---|---|---|---|
| 6,656,824 B1 * | 12/2003 | Hanafi et al. ................ 438/585 |
| 6,680,233 B2 | 1/2004 | Yu et al. |
| 6,812,077 B1 * | 11/2004 | Chan et al. ................ 438/163 |
| 6,909,145 B2 | 6/2005 | Cabral, Jr. et al. |
| 6,974,736 B2 * | 12/2005 | Ku et al. ................ 438/197 |
| 7,109,104 B2 | 9/2006 | Ku et al. |
| 7,144,783 B2 * | 12/2006 | Datta et al. ................ 438/287 |
| 7,176,534 B2 * | 2/2007 | Hanafi et al. ................ 257/382 |
| 7,195,999 B2 | 3/2007 | Forbes et al. |
| 7,235,153 B2 | 6/2007 | Chiu et al. |
| 7,235,502 B2 | 6/2007 | Kalpat et al. |
| 7,282,423 B2 * | 10/2007 | Furukawa et al. ........... 438/422 |
| 2005/0141798 A1 | 6/2005 | Okasaka |
| 2005/0170659 A1 * | 8/2005 | Hanafi et al. ................ 438/723 |
| 2009/0108347 A1 * | 4/2009 | Adkisson et al. ............ 257/339 |
| 2009/0179284 A1 * | 7/2009 | Gambino .................... 257/411 |

* cited by examiner

*Primary Examiner*—Laura M Menz
(74) *Attorney, Agent, or Firm*—Schmeiser, Olsen & Watts; Riyon W. Harding (57) ABSTRACT

A semiconductor structure and a method for forming the same. The structure includes (i) a semiconductor substrate which includes a channel region, (ii) first and second source/drain regions on the semiconductor substrate, (iii) a gate dielectric region, and (iv) a gate electrode region, (v) a plurality of interconnect layers on the gate electrode region, and (vi) first and second spaces. The gate dielectric region is disposed between and in direct physical contact with the channel region and the gate electrode region. The gate electrode region is disposed between and in direct physical contact with the gate dielectric region and the interconnect layers. The first and second spaces are in direct physical contact with the gate electrode region. The first space is disposed between the first source/drain region and the gate electrode region. The second space is disposed between the second source/drain region and the gate electrode region.

12 Claims, 14 Drawing Sheets

SEMICONDUCTOR TRANSISTORS HAVING HIGH-K GATE DIELECTRIC LAYERS, METAL GATE ELECTRODE REGIONS, AND LOW FRINGING CAPACITANCES

FIELD OF THE INVENTION

The present invention relates generally to semiconductor transistors and more particularly to semiconductor transistors having high-K gate dielectric layers, metal gate electrode regions, and low fringing capacitances.

BACKGROUND OF THE INVENTION

In a typical transistor with a high-K gate dielectric layer and a metal gate electrode region, the fringing capacitances between the gate electrode region and the source/drain regions of the transistor detrimentally affect the operation of the transistor. Therefore, there is a need for a structure (and a method for forming the same) in which the fringing capacitances are lower than those of the prior art.

SUMMARY OF THE INVENTION

The present invention provides a semiconductor structure fabrication method, comprising providing a semiconductor structure which includes (i) a semiconductor substrate which includes a channel region, (ii) a first source/drain region on the semiconductor substrate, (iii) a second source/drain region on the semiconductor substrate, wherein the channel region is disposed between the first and second source/drain regions, (iv) a gate dielectric region which includes a first gate dielectric portion, a second gate dielectric portion, and a third gate dielectric portion, wherein the third gate dielectric portion of the gate dielectric region is in direct physical contact with the channel region, wherein the gate dielectric region comprises a first dielectric material having a first dielectric constant, and wherein the first dielectric constant is greater than 4, (v) a gate electrode region, wherein the first gate dielectric portion of the gate dielectric region is disposed between and in direct physical contact with the channel region and the gate electrode region, and wherein the gate electrode region comprises an electrically conductive material, (vi) a first converting portion, wherein the first gate dielectric portion of the gate dielectric region is disposed between and in direct physical contact with the first converting portion and the gate electrode region, and (vii) a second converting portion, wherein the second gate dielectric portion of the gate dielectric region is disposed between and in direct physical contact with the second converting portion and the gate electrode region, and wherein the first and second converting portions comprise a converting material; causing the converting material of the first converting portion to chemically react with the first dielectric material of the first gate dielectric portion of the gate dielectric region resulting in a first spacer dielectric region; and causing the converting material of the second converting portion to chemically react with the first dielectric material of the second gate dielectric portion of the gate dielectric region resulting in a second spacer dielectric region, wherein the first and second spacer dielectric regions comprise a second dielectric material having a second dielectric constant, and wherein the second dielectric constant is lower than the first dielectric constant].

The present invention provides a transistor (and a method for forming the same) in which the fringing capacitances are lower than those of the prior art.

DETAILED DESCRIPTION OF THE INVENTION

Figure 1A:
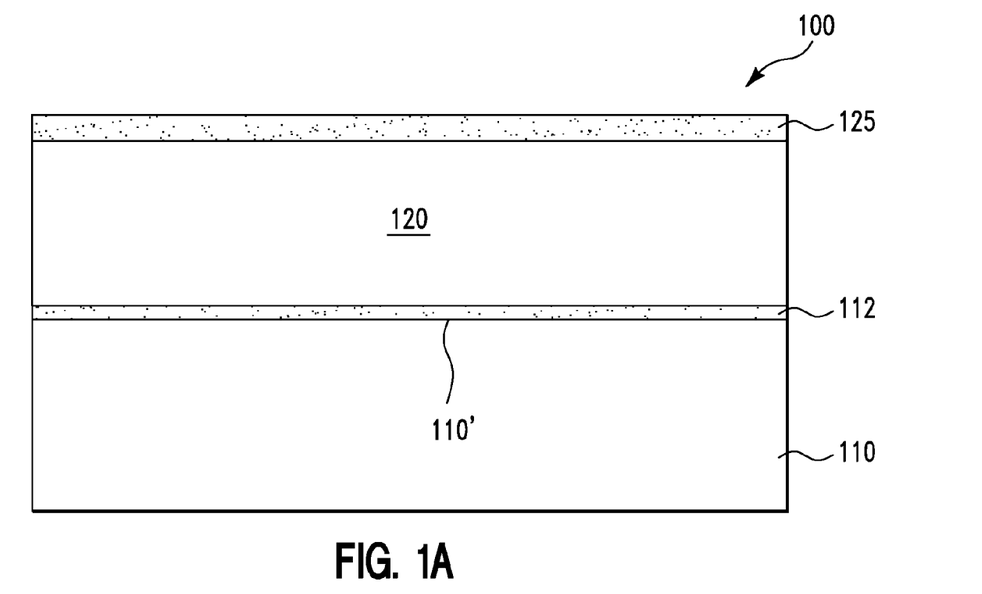
FIGS. 1A-1Q show cross-section views used to illustrate a fabrication process of a semiconductor structure, in accordance with embodiments of the present invention.
Figure 1B:
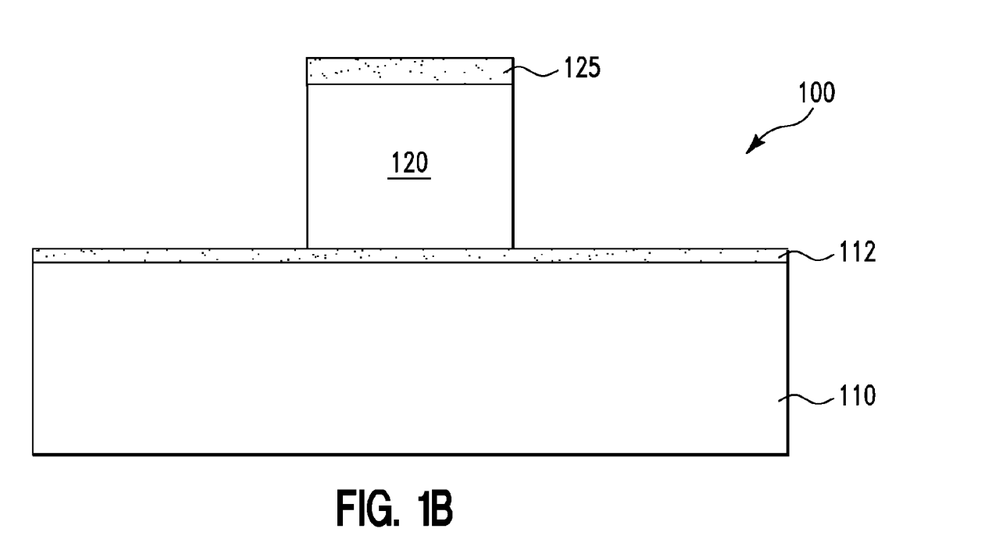
Figure 1C:
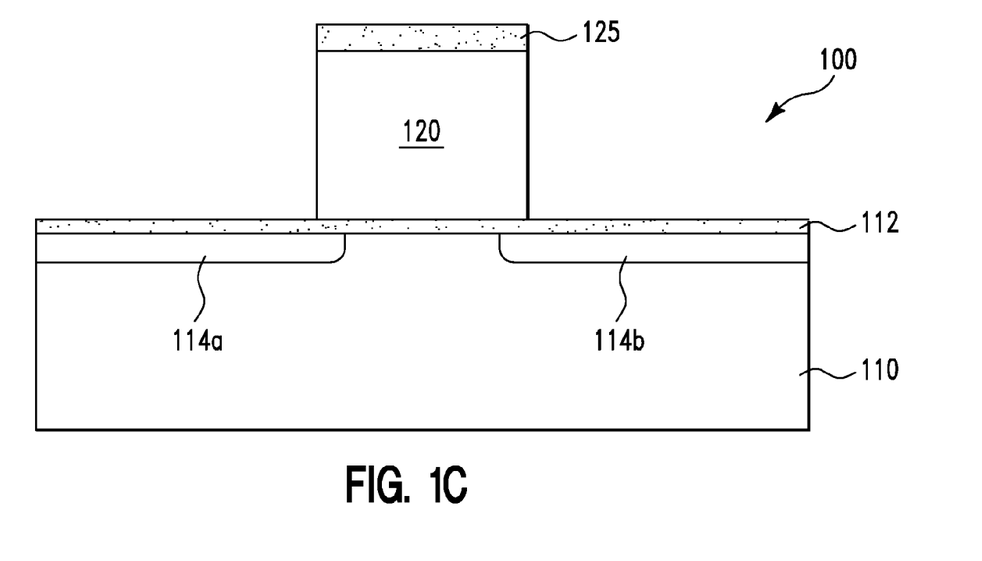
Figure 1D:
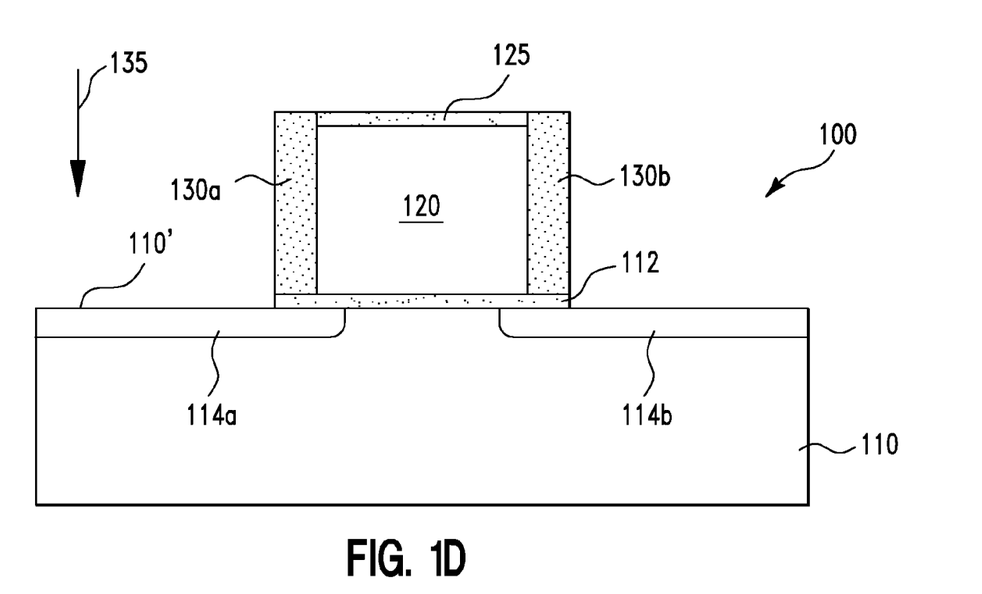
Figure 1E:
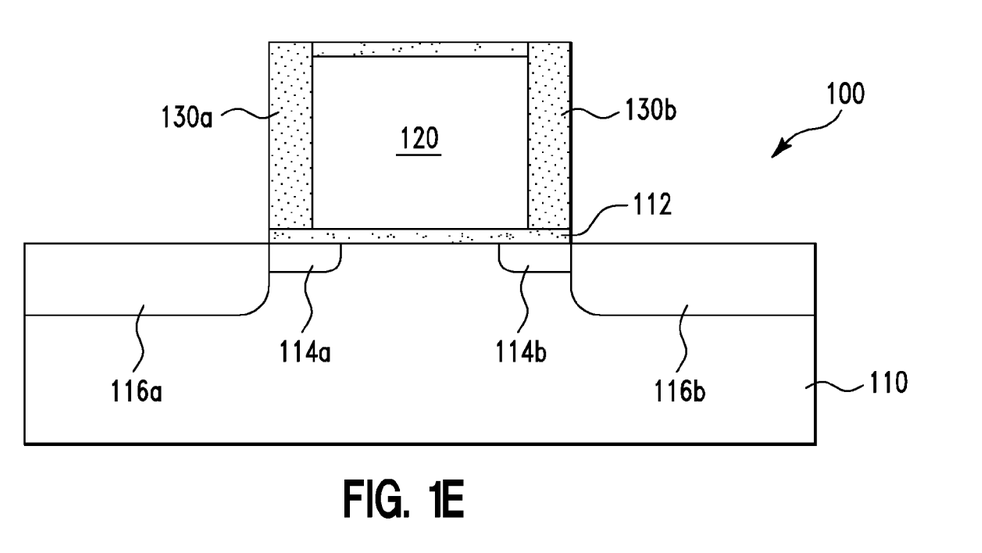
Figure 1F:
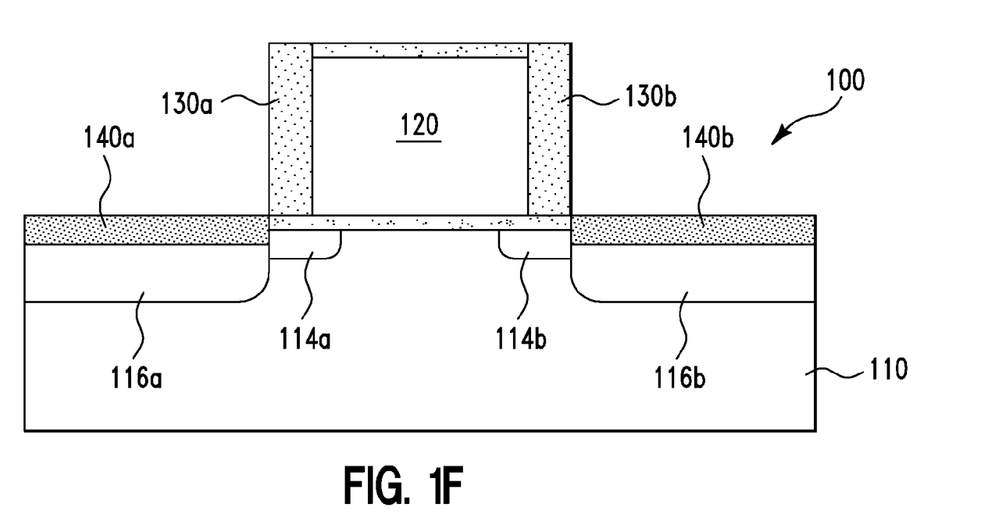
Figure 1G:
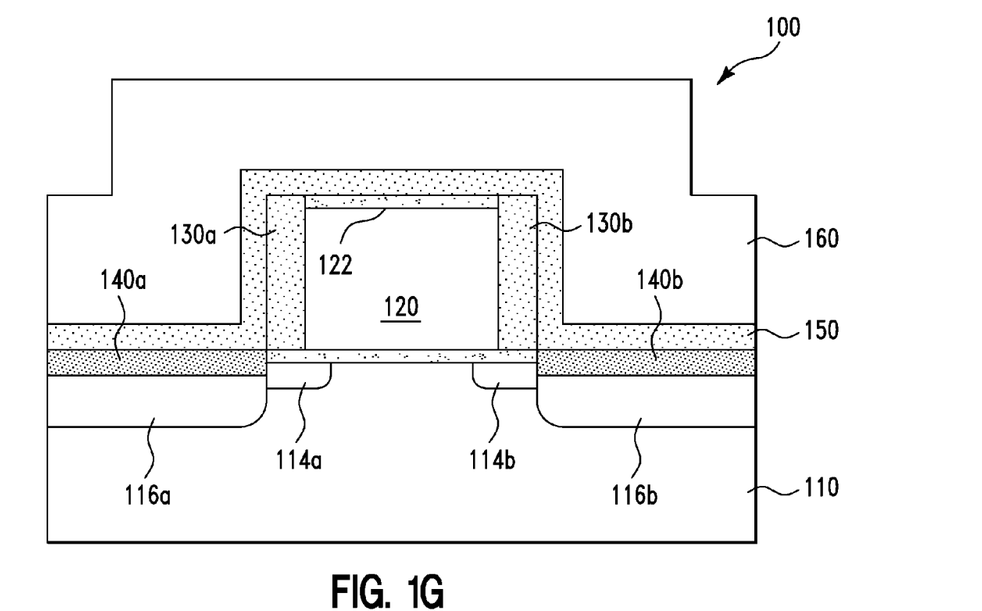
Figure 1H:
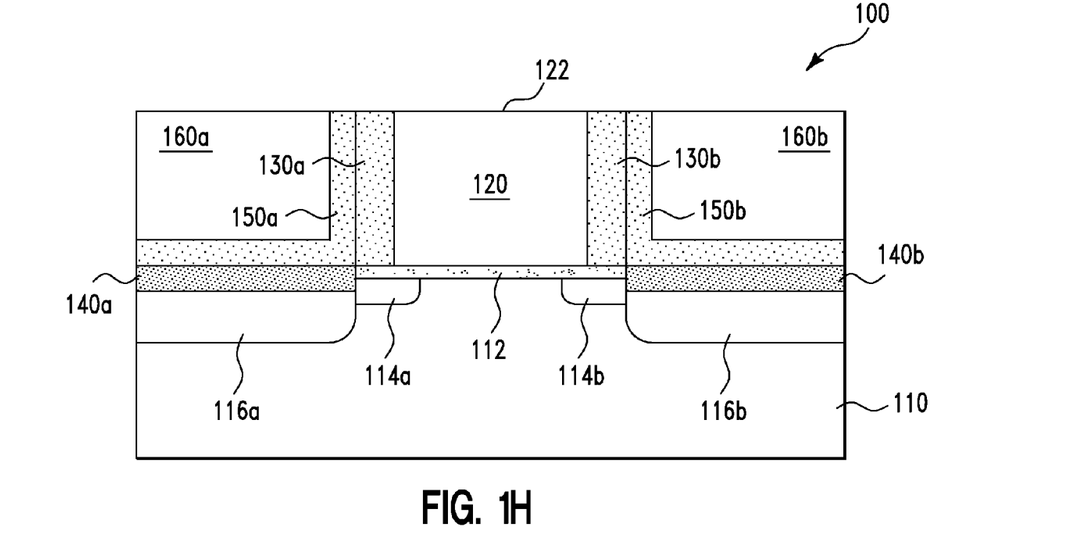
Figure 1I:
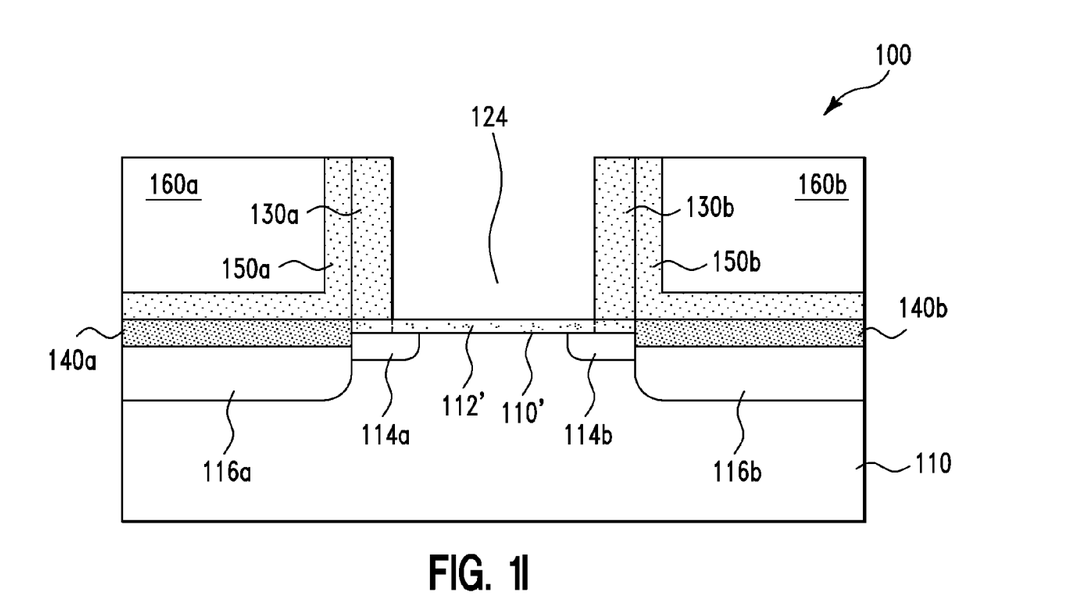
Figure 1J:
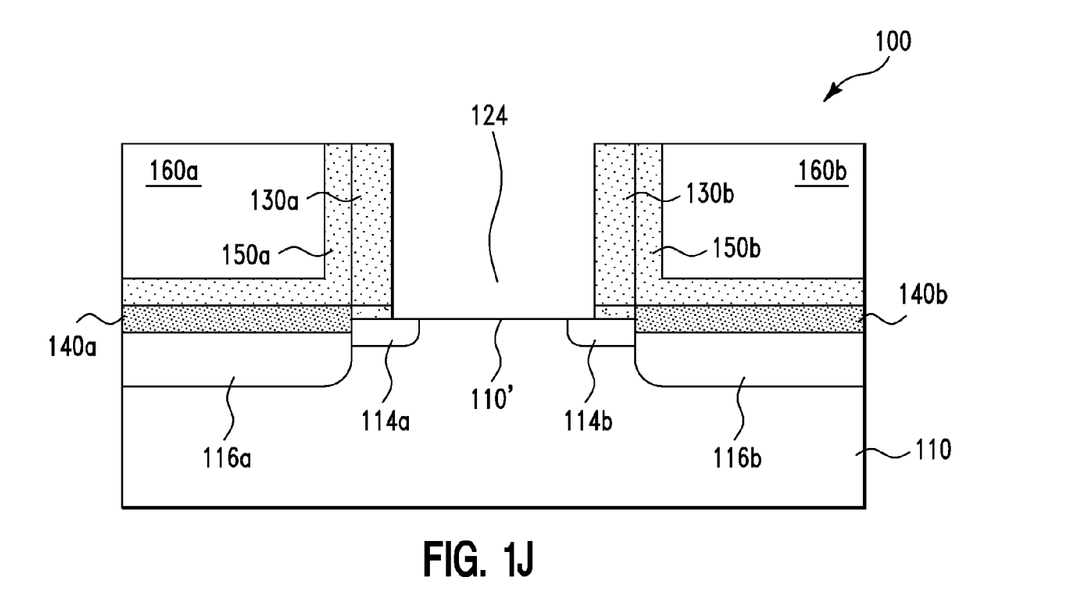
Figure 1K:
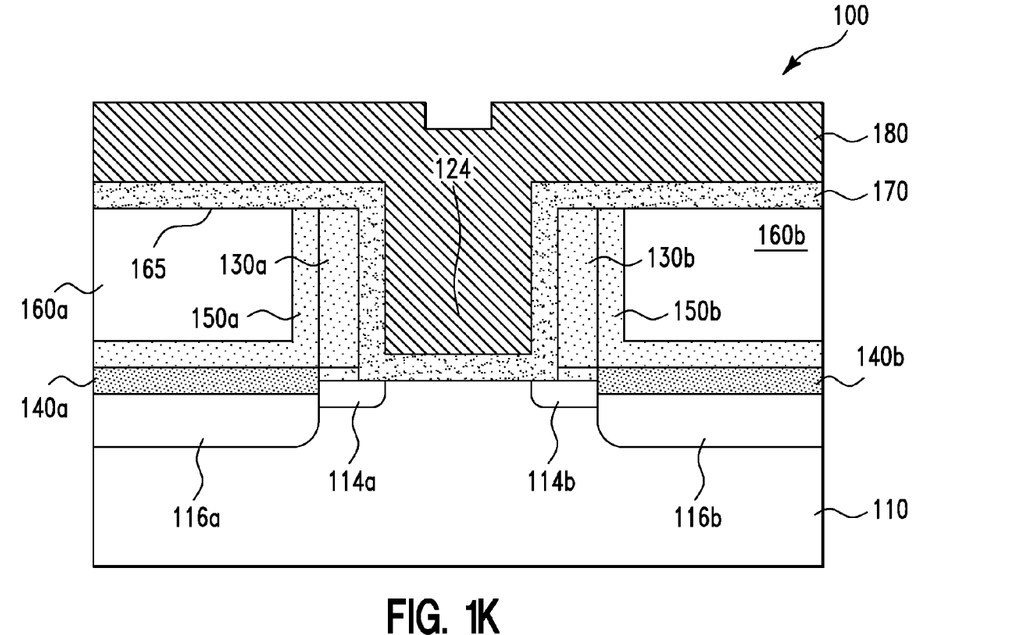
Figure 1L:
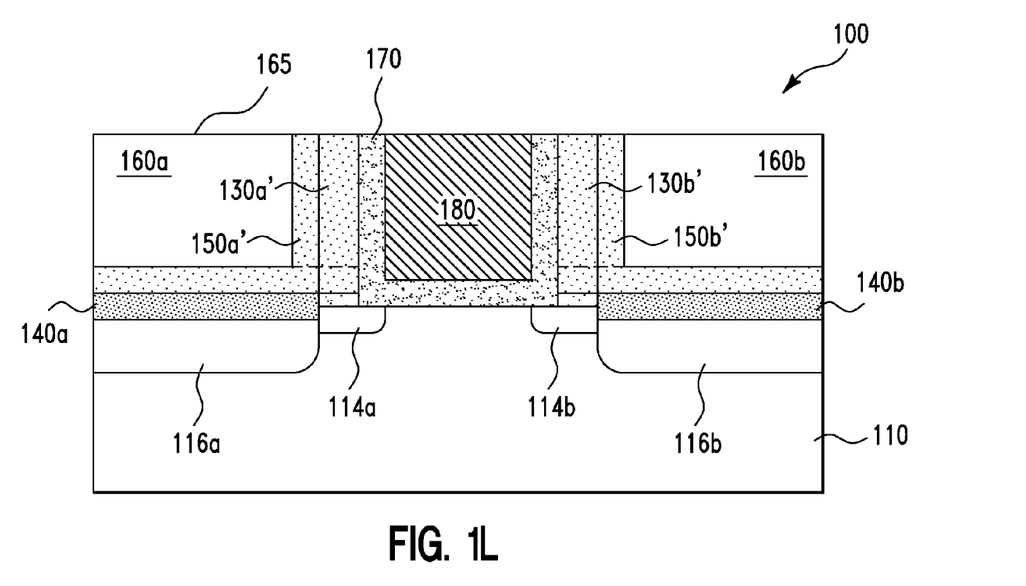
Figure 1M:
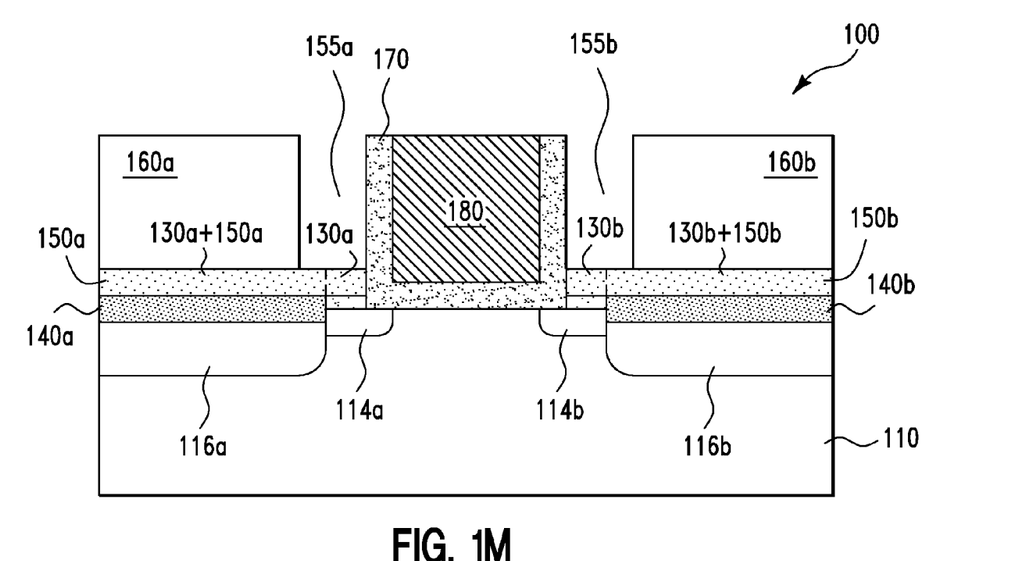
Figure 1N:
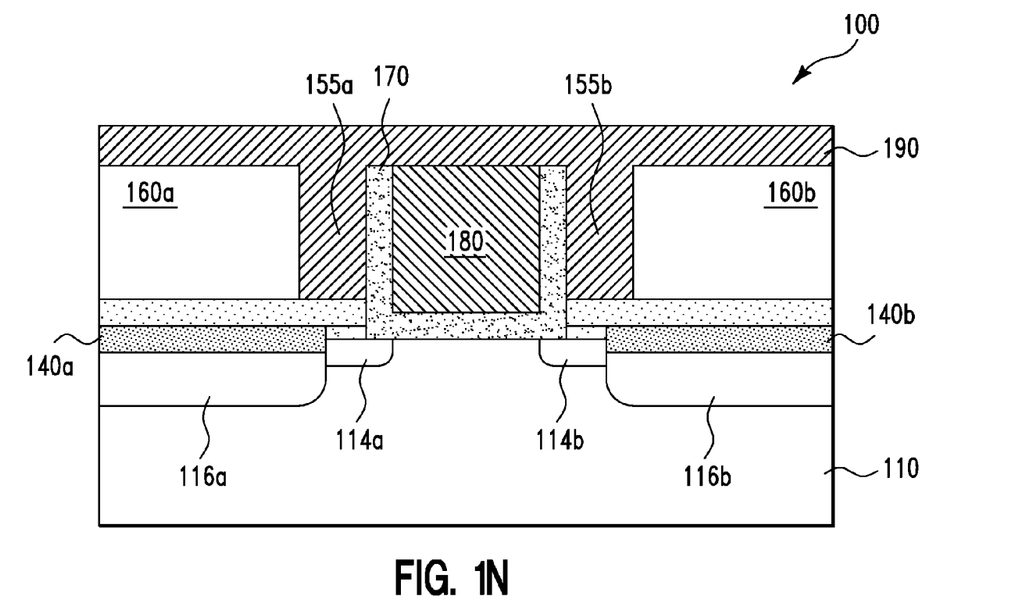
Figure 1O:
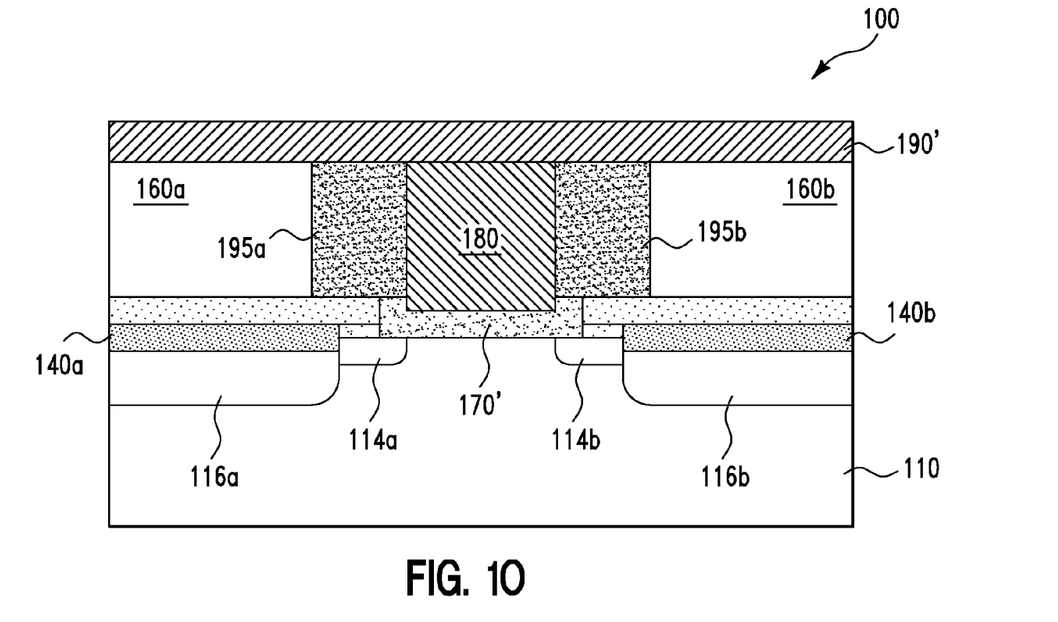
Figure 1P:
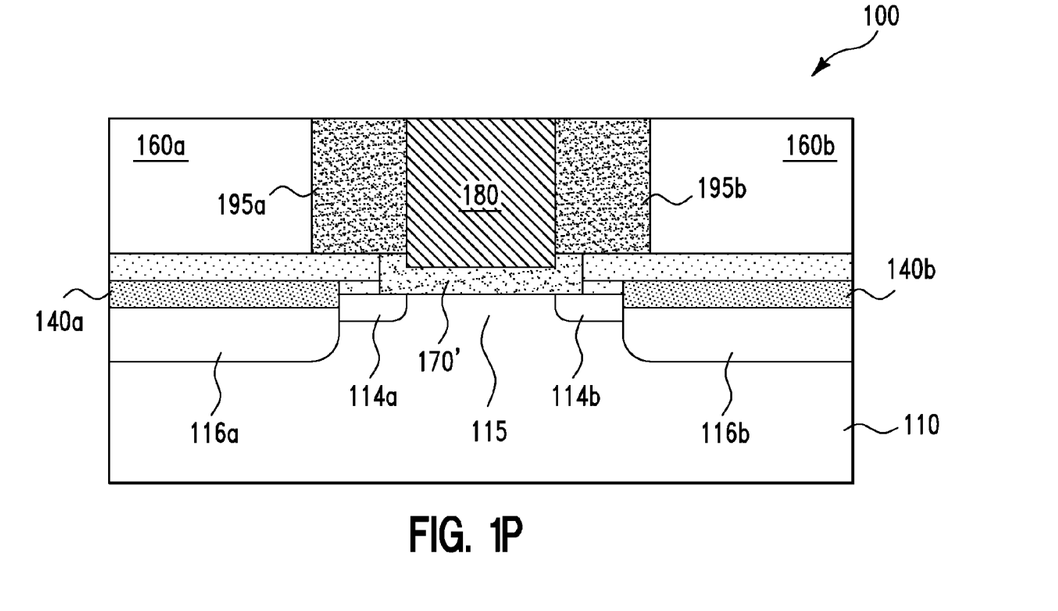
Figure 1Q:
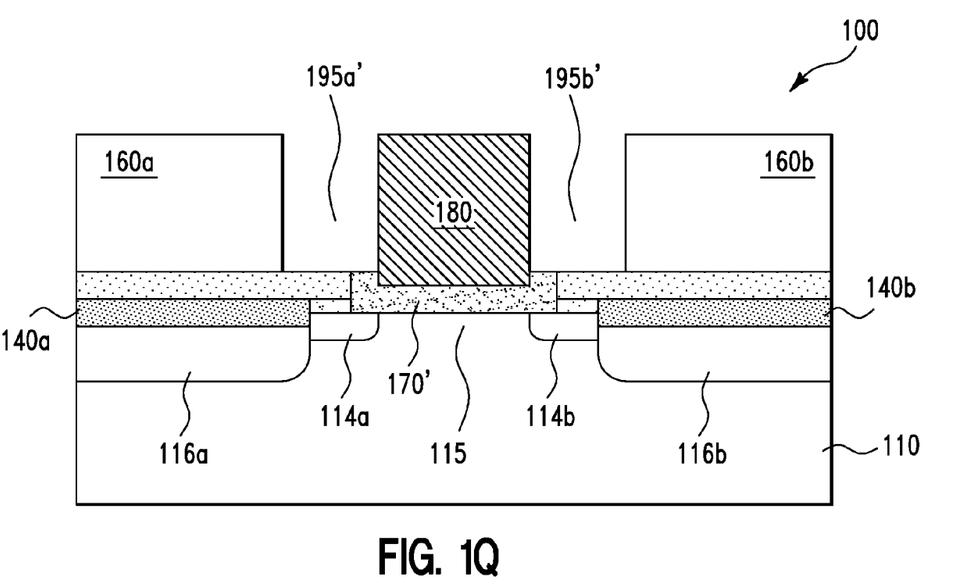

FIGS. 1A-1Q show cross-section views used to illustrate a fabrication process of a semiconductor structure 100, in accordance with embodiments of the present invention. More specifically, with reference to FIG. 1A, the fabrication process of the semiconductor structure 100 can start with a silicon substrate 110.

Next, in one embodiment, a temporary gate dielectric layer 112 is formed on top of the silicon substrate 110. The temporary gate dielectric layer 112 can comprise silicon dioxide. The temporary gate dielectric layer 112 can be formed by thermally oxidizing the top surface 110' of the silicon substrate 110 resulting in the temporary gate dielectric layer 112.

Next, in one embodiment, a temporary gate electrode layer 120 is formed on top of the temporary gate dielectric layer 112. The temporary gate electrode layer 120 can comprise poly-silicon. The temporary gate electrode layer 120 can be formed by CVD (Chemical Vapor Deposition) of poly-silicon on top of the temporary gate dielectric layer 112.

Next, in one embodiment, a cap layer 125 is formed on top of the temporary gate electrode layer 120. The cap layer 125 can comprise silicon dioxide. The cap layer 125 can be formed by CVD of silicon dioxide on top of the temporary gate electrode layer 120.

Next, in one embodiment, the cap layer 125 and the temporary gate electrode layer 120 are patterned resulting in the cap region 125 and the temporary gate electrode region 120 of FIG. 1B. More specifically, the cap layer 125 and the temporary gate electrode layer 120 can be patterned using conventional lithographic and etching processes.

Next, with reference to FIG. 1C, in one embodiment, extension regions 114a and 114b are formed in the silicon substrate 110. More specifically, the extension regions 114a and 114b can be formed by a conventional ion implantation process.

Next, with reference to FIG. 1D, in one embodiment, spacer regions 130a and 130b are formed on the side walls of the temporary gate electrode region 120. The spacer regions 130a and 130b can comprise silicon nitride. The spacer regions 130a and 130b can be formed by (i) depositing a silicon nitride layer (not shown) on top of the structure 100 of FIG. 1C and then (ii) anisotropically etching the silicon nitride layer in a vertical direction defined by an arrow 135 (direction 135) until the top surface 110' of the temporary gate electrode region 110 is exposed to the surrounding ambient resulting in the spacer regions 130a and 130b. The direction 135 is perpendicular to the top surface 110' of the silicon substrate 110 and points from the temporary gate dielectric layer 112 toward the silicon substrate 110.

Next, with reference to FIG. 1E, in one embodiment, source/drain regions 116a and 116b are formed in the silicon substrate 110. More specifically, the source/drain regions 116a and 116b can be formed by a conventional ion implantation process.

Next, with reference to FIG. 1F, in one embodiment, silicide regions 140a and 140b are formed on the source/drain regions 116a and 116b, respectively. The silicide regions 140a and 140b can be formed by (i) depositing a metal layer (not shown) on top of the structure 100 of FIG. 1E, then (ii) heating the structure 100 resulting in the metal chemically reacting with silicon of the source/drain regions 116a and 116b, and then (iii) removing unreacted metal resulting in the silicide regions 140a and 140b. In one embodiment, the silicide region 140a comprises nickel silicide.

Next, with reference to FIG. 1G, in one embodiment, a dielectric layer 150 and a BPSG (boro-phospho-silicate glass) layer 160 are formed on top of the structure 100 of FIG. 1F. In general, the material of the dielectric layer 150 is the same as the material of the spacer regions 130a and 130b (i.e., silicon nitride). The dielectric layer 150 and the BPSG layer 160 can be formed by (i) depositing silicon nitride on top of the structure 100 of FIG. 1F resulting in the dielectric layer 150 and then (ii) depositing BPSG on top of the dielectric layer 150 resulting in the BPSG layer 160.

Next, in one embodiment, a CMP (Chemical Mechanical Polishing) process is performed on top of the structure 100 of FIG. 1G until the top surface 122 of the temporary gate electrode region 120 is exposed to the surrounding ambient resulting in the structure 100 of FIG. 1H. After the CMP process is performed, what remain of the BPSG layer 160 are BPSG regions 160a and 160b, and what remain of the dielectric layer 150 are dielectric regions 150a and 150b.

Next, with reference to FIG. 1H, in one embodiment, the temporary gate electrode region 120 is removed resulting in a trench 124 of FIG. 1I. The temporary gate electrode region 120 can be removed by a wet etching process.

Next, with reference to FIG. 1I, in one embodiment, a portion 112' of the temporary gate dielectric region 112 is removed resulting in the top surface 110' of the silicon substrate 110 being exposed to the surrounding ambient, as shown in FIG. 1J. The portion 112' can be removed by a wet etching process.

Next, with reference to FIG. 1K, in one embodiment, a gate dielectric layer 170 and an electrically conductive layer 180 are formed on top of the structure 100 of FIG. 1J. The gate dielectric layer 170 can comprise a high-K dielectric material, wherein K is a dielectric constant and K is greater than 4. For example, the gate dielectric layer 170 comprises hafnium silicon oxynitride ($Hf_xSi_yO_zN_w$). The electrically conductive layer 180 can comprise a metal such as tantalum nitride (TaN). The gate dielectric layer 170 and the electrically conductive layer 180 can be formed by (i) CVD or ALD (Atomic Layer Deposition) of the $Hf_xSi_yO_zN_w$ on top of the structure 100 of FIG. 1J resulting in the gate dielectric layer 170 and then (ii) CVD or ALD of tantalum nitride on top of the gate dielectric layer 170 such that the trench 124 is completely filled with tantalum nitride resulting in the electrically conductive layer 180.

Next, in one embodiment, a CMP process is performed on top of the structure 100 of FIG. 1K until the top surface 165 of the BPSG regions 160a and 160b are exposed to the surrounding ambient resulting in the structure 100 of FIG. 1L. After the CMP process is performed, what remain of the gate dielectric layer 170 and the electrically conductive layer 180 are the gate dielectric region 170 and the gate electrode region 180, respectively.

Next, with reference to FIG. 1L, in one embodiment, portions 130a' and 130b' of the spacer regions 130a and 130b, respectively, and portions 150a' and 150b' of the dielectric regions 150a and 150b, respectively, are removed resulting in trenches 155a and 155b of FIG. 1M. After the removal of the portions 130a', 130b', 150a', and 150b' is performed, what remain of the spacer region 130a and the dielectric region 150a can be collectively referred to as a dielectric region 130a+150a, and what remain of the spacer region 130b and the silicon nitride region 150b can be collectively referred to as a dielectric region 130b+150b.

Next, with reference to FIG. 1N, in one embodiment, a titanium layer 190 is formed on top of the structure 100 of FIG. 1M such that the trenches 155a and 155b are completely filled with titanium. The titanium layer 190 can be formed by ALD of titanium on top of the structure 100 of FIG. 1M.

Next, in one embodiment, the structure 100 is annealed at a temperature around 400-600° C. resulting in titanium of the layer 190 chemically reacting with $Hf_xSi_yO_zN_w$ of the gate dielectric region 170 resulting in the dielectric regions 195a and 195b of FIG. 1O which comprise titanium hafnium silicon oxynitride ($Ti_vHf_xSi_yO_zN_w$) $Ti_vHf_xSi_yO_zN_w$ is a low-K dielectric material. After the annealing of the structure 100 is performed, what remains of the gate dielectric region 170 is the gate dielectric region 170', and unreacted titanium of the layer 190 can be referred to as the titanium layer 190'.

In the embodiments described above, the material of the gate dielectric layer 170 (FIG. 1K) is $Hf_xSi_yO_zN_w$ and the material of the layer 190 is titanium. In general, the material of the gate dielectric layer 170 and the material of the layer 190 can be selected such that (i) the material of the gate dielectric layer 170 is a high-K dielectric material (K>4) and (ii) at a high temperature (e.g., around 400-600°), the material of the gate dielectric layer 170 and the material of the layer 190 chemically react with each other resulting in a low-K dielectric material (K<4).

Next, with reference to FIG. 1O, in one embodiment, the titanium layer 190' is removed resulting in the structure 100 of FIG. 1P. The titanium layer 190' can be removed by a selective wet etching process.

With reference to FIG. 1P, the structure 100 shows a transistor having the gate electrode region 180, the gate dielectric region 170', the source/drain regions 116a and 116b and the channel 115. The dielectric regions 195a and 195b can be referred to as spacer dielectric regions 195a and 195b.

Next, in one embodiment, interconnect layers (not shown) are formed on top of the structure 100 to provide electrical access to the transistor of FIG. 1P.

It should be noted that the fringing capacitance between the gate electrode region 180 and the source/drain region 116a depends on the dielectric constants of the materials of the dielectric regions disposed between the gate electrode region 180 and the source/drain region 116a. Similarly, the fringing capacitance between the gate electrode region 180 and the source/drain region 116b depends on the dielectric constants of the materials of the dielectric regions disposed between the gate electrode region 180 and the source/drain region 116b. In general, it is desirable to reduce dielectric constants of these dielectric regions so as to reduce the fringing capacitances.

With reference to FIGS. 1N and 1O, as described above, $Hf_xSi_yO_zN_w$ of the gate dielectric region 170 is converted to $Ti_vHf_xSi_yO_zN_w$ of the dielectric regions 195a and 195b which has a lower dielectric constant than $Hf_xSi_yO_zN_w$ of the gate dielectric region 170. As a result, the fringing capacitances between the gate electrode region 180 and the source/drain regions 116a and 160b are reduced.

In the embodiments described above, the interconnect layers are formed on top of the structure 100 to provide electrical access to the transistor of FIG. 1P. Alternatively, with reference to FIG. 1P, before the interconnect layers are formed on top of the structure 100, the dielectric regions 195a and 195b are removed resulting in trenches 195a' and 195b' of FIG. 1Q. More specifically, the dielectric regions 195a and 195b can be removed by a wet etching process.

Next, in one embodiment, the interconnect layers (not shown) are formed on top of the structure 100 of FIG. 1Q to provide electrical access to the transistor of FIG. 1Q such that the trenches 195a' and 195b' are not completely filled by solid material. As a result, the trenches 195a' and 195b' can still contain some spaces (not shown) that contain gases, vapors, and/or vacuum. In one embodiment, these spaces are in direct physical contact with the gate electrode region 180. These spaces can be in direct physical contact with the gate dielectric region 170'.

It should be noted that after the interconnect layers are formed, the dielectric constants of the materials that fill the trenches 195a' and 195b' (dielectric solid materials, gases, vapors, and/or vacuum) are lower than that of $Ti_vHf_xSi_yO_zN_w$ of the dielectric regions 195a and 195b of FIG. 1P. Therefore, fringing capacitances between the gate electrode region 180 and the source/drain regions 116a and 116b are further reduced.

Figure 2A:
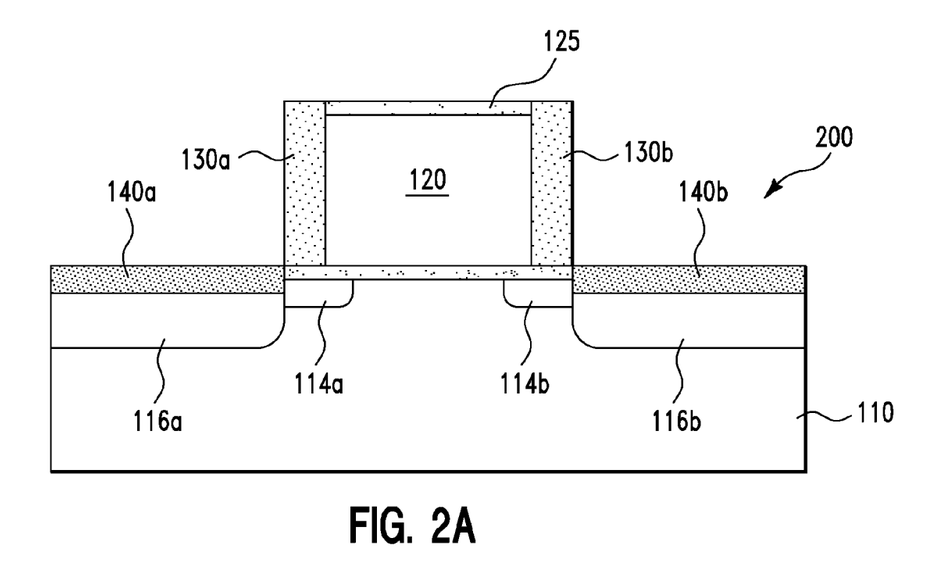
FIGS. 2A-2K show cross-section views used to illustrate a fabrication process of another semiconductor structure, in accordance with embodiments of the present invention.

FIGS. 2A-2K show cross-section views used to illustrate a fabrication process of a semiconductor structure 200, in accordance with embodiments of the present invention. More specifically, with reference to FIG. 2A, the fabrication process of the semiconductor structure 200 can start with the structure 200 of FIG. 2A. The structure 200 of FIG. 2A is similar to the structure 100 of FIG. 1F. The formation of the structure 200 is similar to the formation of the structure 100 of FIG. 1F.

Next, in one embodiment, the spacer regions 130a and 130b are removed. More specifically, the spacer regions 130a and 130b can be removed by a wet etching process.

Figure 2B:
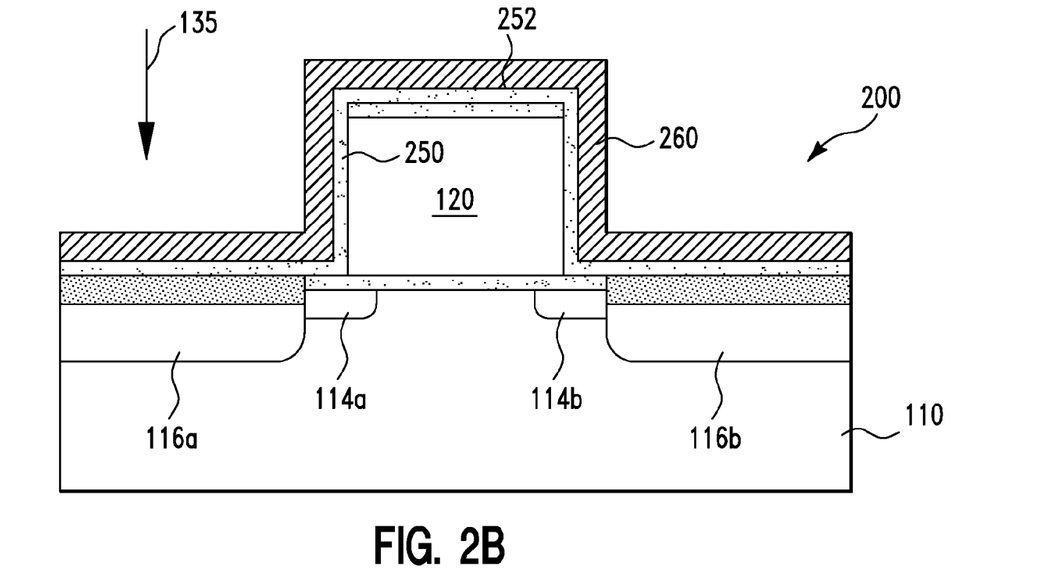

Next, with reference to FIG. 2B, in one embodiment, a dielectric layer 250 and a titanium layer 260 are formed in turn. The dielectric layer 250 can comprise silicon dioxide. The dielectric layer 250 and the titanium layer 260 can be formed using conventional processes.

Figure 2C:
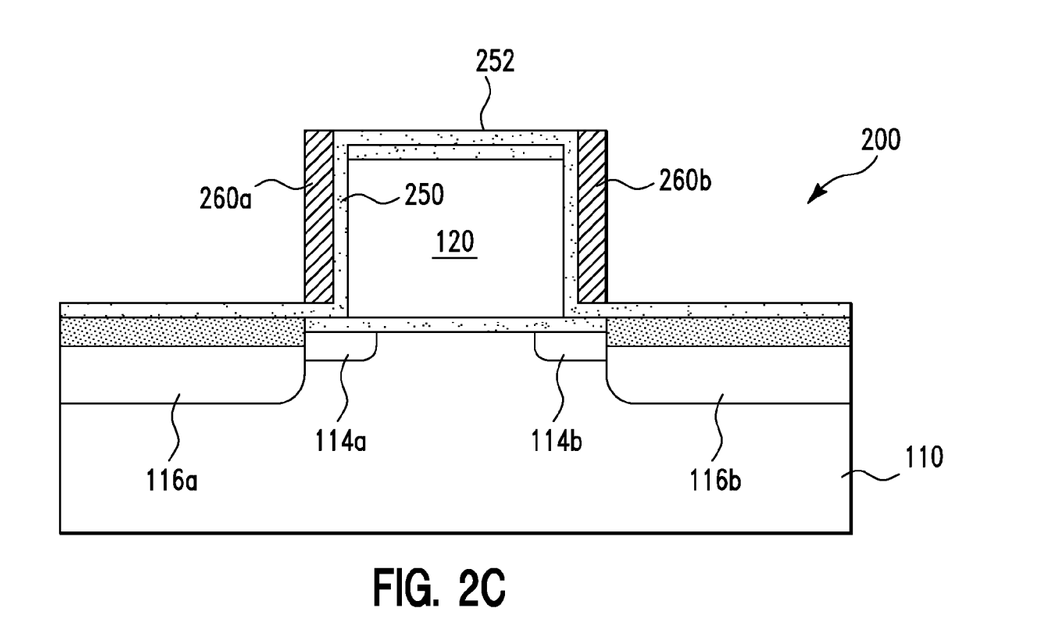

Next, in one embodiment, an anisotropic etching process is performed in the direction 135 until the top surface 252 of the dielectric layer 250 is exposed to the surrounding ambient resulting in the structure 200 of FIG. 2C. After the anisotropic etching process is performed, what remain of the titanium layer 260 are titanium regions 260a and 260b on side walls of the temporary gate electrode region 120.

Figure 2D:
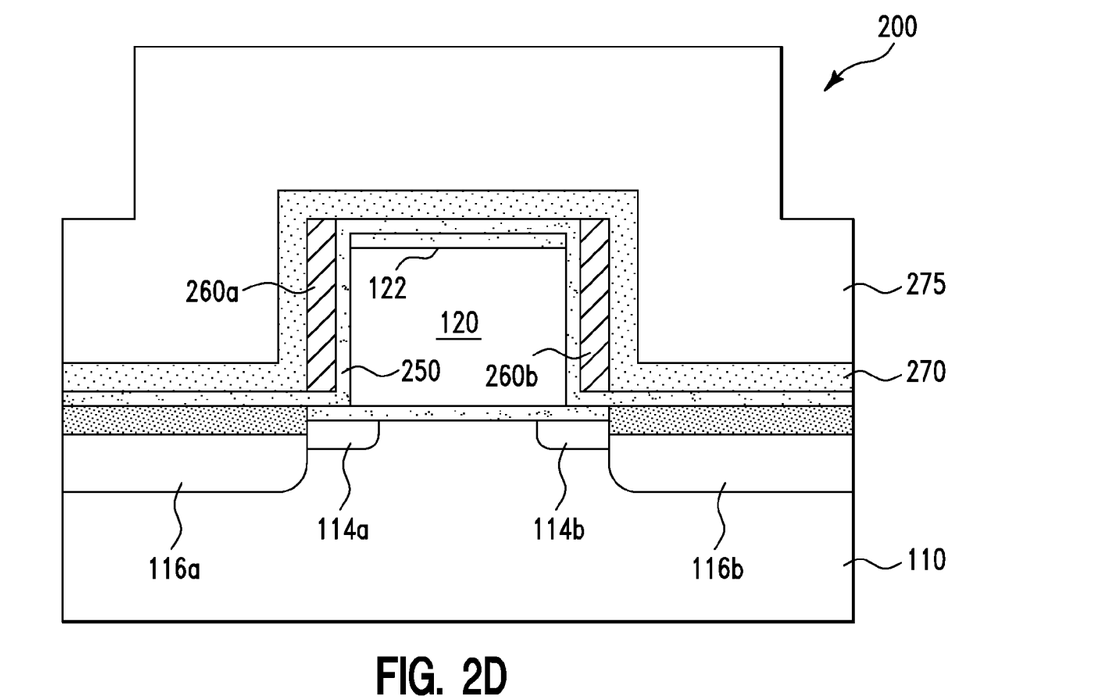

Next, with reference to FIG. 2D, in one embodiment, a dielectric layer 270 and a BPSG layer 275 are formed on top of the structure 200 of FIG. 2C. More specifically, the dielectric layer 270 and the BPSG layer 275 can be formed by (i) depositing silicon nitride on top of the structure 200 of FIG. 2C resulting in the dielectric layer 270 and then (ii) depositing BPSG on top of the dielectric layer 270 resulting in the BPSG layer 275.

Figure 2E:
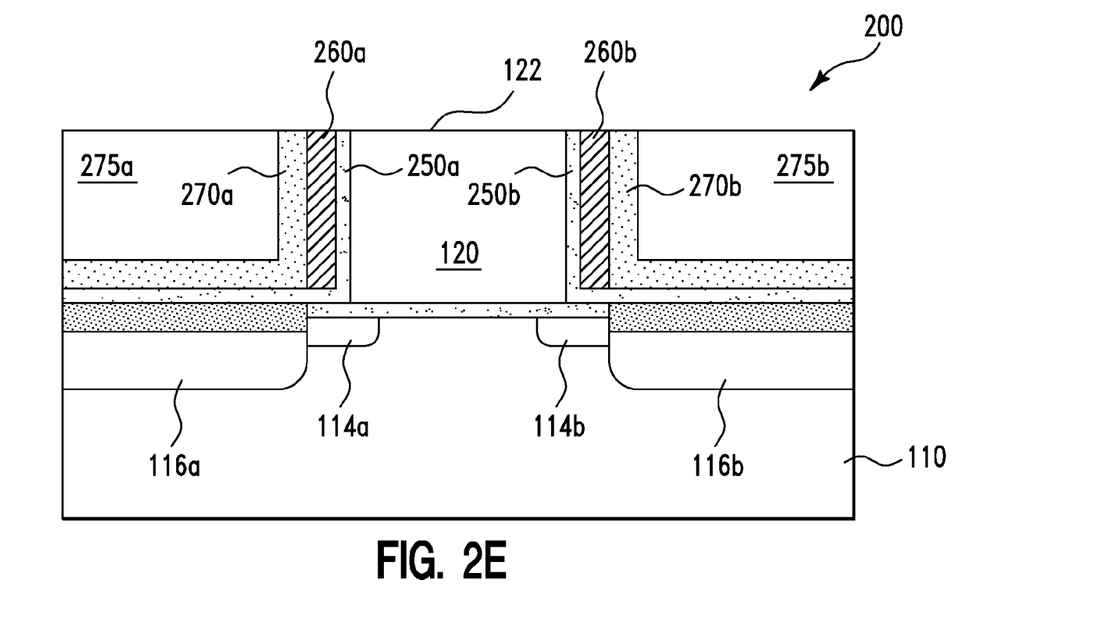

Next, in one embodiment, a CMP process is performed on top of the structure 200 of FIG. 2D until the top surface 122 of the temporary gate electrode region 120 is exposed to the surrounding ambient resulting in the structure 200 of FIG. 2E. After the CMP process is performed, what remain of the dielectric layer 270 are dielectric regions 270a and 270b, and what remain of the BPSG layer 275 are BPSG regions 275a and 275b.

Figure 2F:
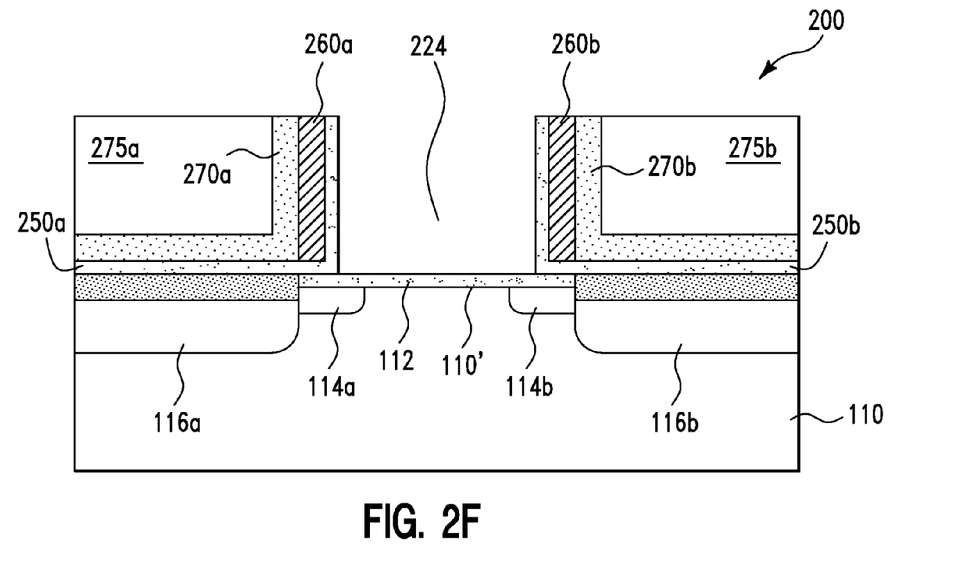

Next, with reference to FIG. 2E, in one embodiment, the temporary gate electrode region 120 is removed resulting in a trench 224 of FIG. 2F. More specifically, the temporary gate electrode region 120 can be removed by a wet etching process.

Figure 2G:
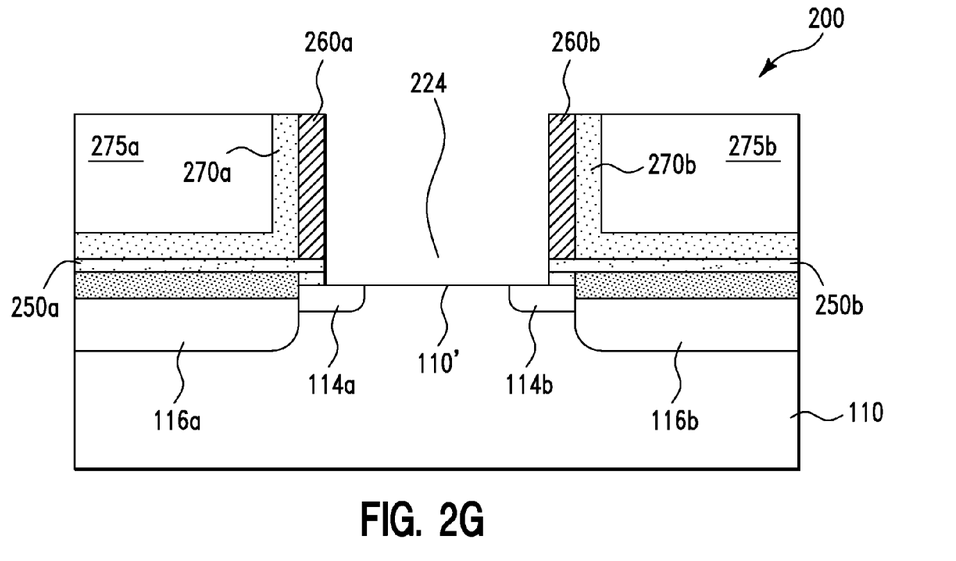

Next, with reference to FIG. 2F, in one embodiment, silicon dioxide on side walls and bottom walls of the trench 224 are removed such that the top surface 110' of the substrate 110 and side walls of the titanium regions 260a and 260b are exposed to the surrounding ambient resulting in the structure 200 of FIG. 2G.

Figure 2H:
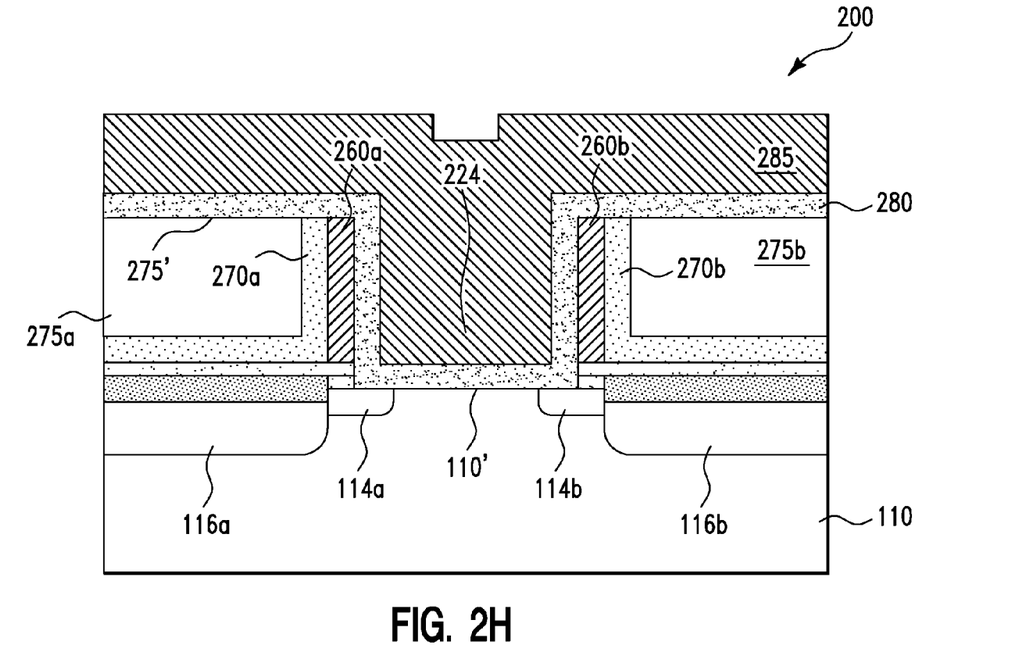

Next, with reference to FIG. 2H, in one embodiment, a gate dielectric layer 280 and an electrically conductive layer 285 are formed on top of the structure 200 of FIG. 2G. The gate dielectric layer 280 can comprise $Hf_xSi_yO_zN_w$. The electrically conductive layer 285 can comprise tantalum nitride. The gate dielectric layer 280 and the electrically conductive layer 280 can be formed by (i) CVD or ALD of the $Hf_xSi_yO_zN_w$ on top of the structure 200 of FIG. 2G resulting in the gate dielectric layer 280 and then (ii) CVD or ALD of tantalum nitride on top of the gate dielectric layer 280 such that the trench 224 is completely filled with tantalum nitride resulting in the electrically conductive layer 285.

Figure 2I:
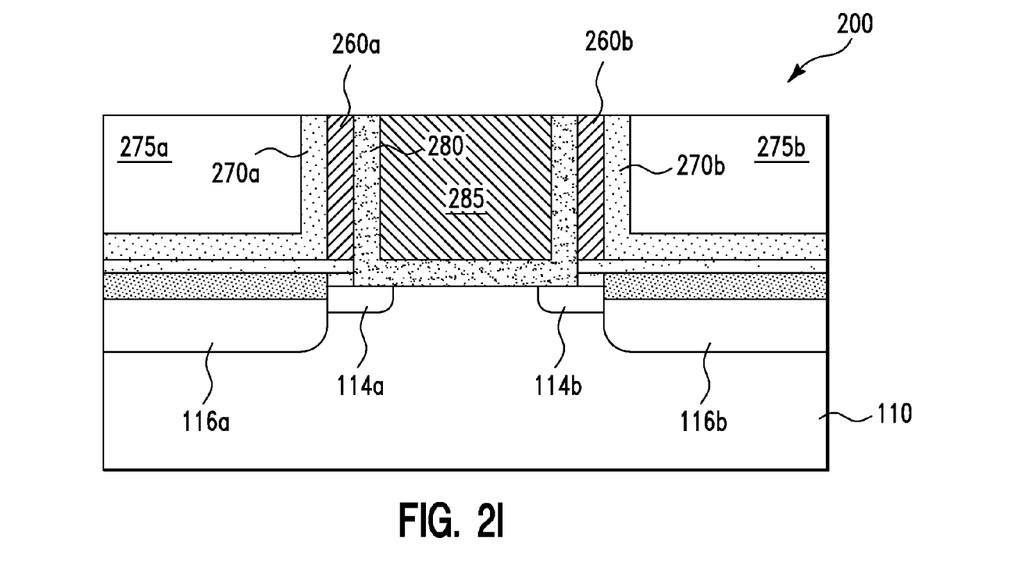

Next, in one embodiment, a CMP process is performed on top of the structure 200 of FIG. 2H until the top surface 275' of the BPSG regions 275a and 275b is exposed to the surrounding ambient resulting in the structure 200 of FIG. 2I. After the CMP process is performed, what remains of the gate dielectric layer 280 is the gate dielectric region 280, and what remains of the electrically conductive layer 285 is the electrically conductive region 285.

Figure 2J:
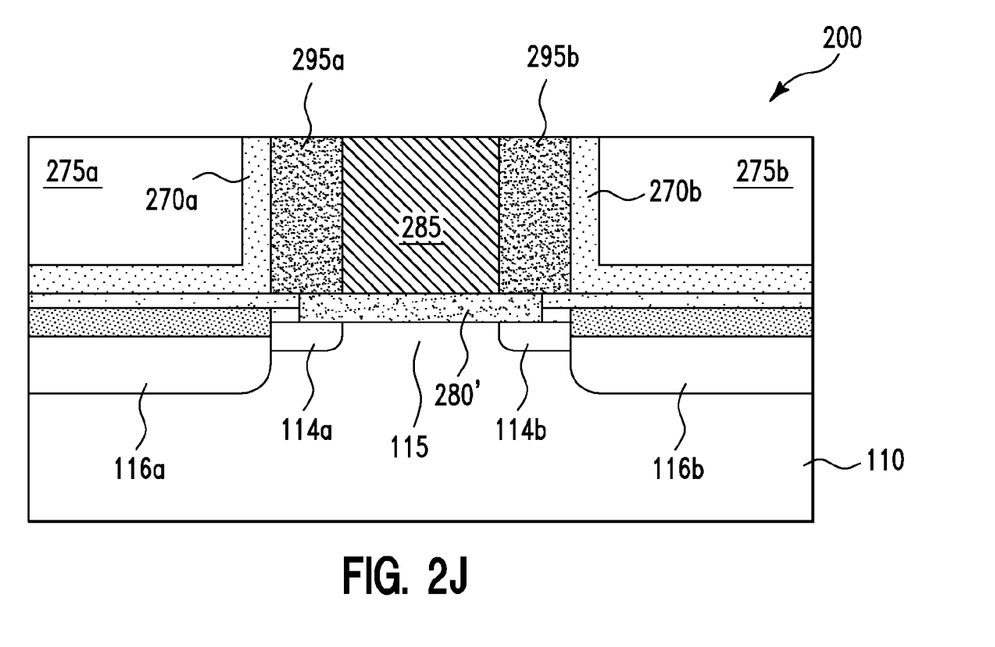

Next, in one embodiment, the structure 200 is annealed at a temperature around 400-600° C. resulting in titanium of the regions 260a and 260b chemically reacting with $Hf_xSi_yO_zN_w$ of the gate dielectric region 280 resulting in the dielectric regions 295a and 295b of FIG. 2J which comprise $Ti_vHf_xSi_yO_zN_w$. $Ti_vHf_xSi_yO_zN_w$ is a low-K dielectric material. After the annealing of the structure 200 is performed, what remains of the gate dielectric region 280 is the gate dielectric region 280'.

In the embodiments described above, the material of the gate dielectric layer 280 (FIG. 2H) is $Hf_xSi_yO_zN_w$ and the material of the layer 260 (FIG. 2B) is titanium. In general, the material of the gate dielectric layer 280 and the material of the layer 260 can be selected such that (i) the material of the gate dielectric layer 280 is a high-K dielectric material (K>4) and (ii) at a high temperature (e.g., around 400-600°), the material of the gate dielectric layer 280 and the material of the layer 260 chemically react with each other resulting in a low-K dielectric material (K<4).

With reference to FIG. 2J, the structure 200 shows a transistor having the gate electrode region 285, the gate dielectric region 280', the source/drain regions 116a and 116b and the channel 115. The dielectric regions 295a and 295b can be referred to as spacer dielectric regions 295a and 295b.

Next, in one embodiment, interconnect layers (not shown) are formed on top of the structure 200 to provide electrical access to the transistor of FIG. 2J.

With reference to FIGS. 2I and 2J, as described above, $Hf_xSi_yO_zN_w$ of the gate dielectric region 280 is converted to $Ti_vHf_xSi_yO_zN_w$ of the dielectric regions 295a and 295b which has a lower dielectric constant than $Hf_xSi_yO_zN_w$ of the gate dielectric region 280. As a result, the fringing capacitances between the gate electrode region 285 and the source/drain regions 116a and 160b are reduced.

In the embodiments described above, the interconnect layers are formed on top of the structure 200 to provide electrical access to the transistor of FIG. 2J. Alternatively, with reference to FIG. 2J, before the interconnect layers are formed on top of the structure 200, the dielectric regions 295a and 295b are removed resulting in trenches 295a' and 295b' of FIG. 2K. More specifically, the dielectric regions 295a and 295b can be removed by a wet etching process.

Figure 2K:
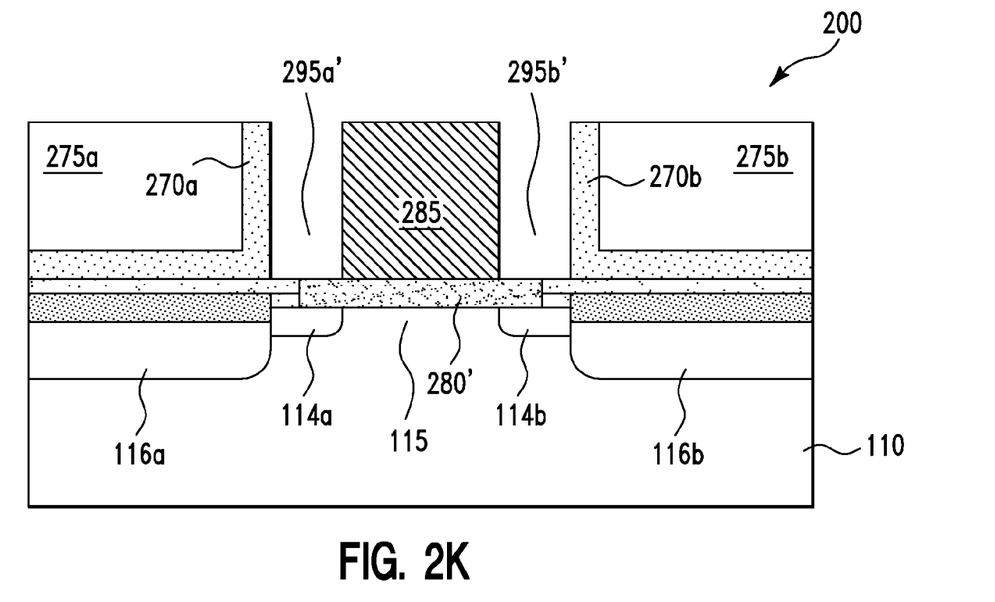

Next, in one embodiment, the interconnect layers (not shown) are formed on top of the structure 200 of FIG. 2K to provide electrical access to the transistor of FIG. 2K such that the trenches 295a' and 295b' are not completely filled by solid material. As a result, the trenches 295a' and 295b' can still contain some spaces (not shown) that contain gases, vapors and/or vacuum. In one embodiment, these spaces are in direct physical contact with the gate electrode region 285. These spaces can be in direct physical contact with the gate dielectric region 280'.

It should be noted that after the interconnect layers are formed, the dielectric constants of the materials that fill the trenches 295a' and 295b' (dielectric solid materials, gases, vapors, and/or vacuum) are lower than that of $Ti_xHf_xSi_yO_zN_w$ of the dielectric regions 295a and 295b of FIG. 2J. Therefore, fringing capacitances between the gate electrode region 285 and the source/drain regions 116a and 116b are further reduced.

In the embodiments described above, the layer 190 (FIG. 1N) and the layer 260 (FIG. 2B) comprise Ti. Alternatively, each of the layers 190 and 260 can comprise Zirconium (Zr) or hafnium (Hf).

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A semiconductor structure fabrication method, comprising:
    providing a semiconductor structure which includes:
        (i) a semiconductor substrate which includes a channel region,
        (ii) a first source/drain region on the semiconductor substrate,
        (iii) a second source/drain region on the semiconductor substrate, wherein the channel region is disposed between the first and second source/drain regions,
        (iv) a gate dielectric region which includes a first gate dielectric portion, a second gate dielectric portion, and a third gate dielectric portion,
            wherein the third gate dielectric portion of the gate dielectric region is in direct physical contact with the channel region,
            wherein the gate dielectric region comprises a first dielectric material having a first dielectric constant, and
            wherein the first dielectric constant is greater than 4,
        (v) a gate electrode region,
            wherein the first gate dielectric portion of the gate dielectric region is disposed between and in direct physical contact with the channel region and the gate electrode region, and
            wherein the gate electrode region comprises an electrically conductive material,
        (vi) a first converting portion, wherein the first gate dielectric portion of the gate dielectric region is disposed between and in direct physical contact with the first converting portion and the gate electrode region, and
        (vii) a second converting portion,
            wherein the second gate dielectric portion of the gate dielectric region is disposed between and in direct physical contact with the second converting portion and the gate electrode region, and
            wherein the first and second converting portions comprise a converting material;
    causing the converting material of the first converting portion to chemically react with the first dielectric material of the first gate dielectric portion of the gate dielectric region resulting in a first spacer dielectric region; and
    causing the converting material of the second converting portion to chemically react with the first dielectric material of the second gate dielectric portion of the gate dielectric region resulting in a second spacer dielectric region,
        wherein the first and second spacer dielectric regions comprise a second dielectric material having a second dielectric constant, and
        wherein the second dielectric constant is lower than the first dielectric constant.

2. The method of claim 1, wherein said causing the converting material of the first converting portion to chemically react and said causing the converting material of the second converting portion to chemically react are performed simultaneously.

3. The method of claim 2, wherein said causing the converting material of the first converting portion to chemically react and said causing the converting material of the second converting portion to chemically react comprise annealing the semiconductor structure.

4. The method of claim 1, further comprising, after said causing the converting material of the first converting portion to chemically react and said causing the converting material of the second converting portion to chemically react are performed, forming interconnect layers on top of the semiconductor structure.

5. The method of claim 1, further comprising removing the first and second spacer dielectric regions.

6. The method of claim 5, further comprising, after said removing the first and second spacer dielectric regions is performed, forming interconnect layers on top of the semiconductor structure.

7. The method of claim 1, wherein the gate dielectric region comprises hafnium silicon oxynitride.

8. The method of claim 7,
    wherein the first converting portion and the second converting portion comprise titanium, and
    wherein the second dielectric material comprises titanium hafnium silicon oxynitride.

9. The method of claim 1, wherein said providing the semiconductor structure comprises:
    providing the semiconductor substrate;
    forming the first and second source/drain regions;
    forming the gate dielectric region;
    forming the gate electrode region; and
    after said forming the gate dielectric region is performed, forming the first and second converting portions.

10. The method of claim 9, wherein said forming the first and second converting portions comprises:
    replacing a first temporary dielectric portion of the semiconductor structure with the first converting portion; and
    replacing a second temporary dielectric portion of the semiconductor structure with the second converting portion.

11. The method of claim 1, wherein said providing the semiconductor structure comprises:
    providing the semiconductor substrate;
    forming the first and second source/drain regions;
    forming the first and second converting portions;
    after said forming the first and second converting portions is performed, forming the gate dielectric region; and
    after said forming the gate dielectric region is performed, forming the gate electrode region.

12. The method of claim 1, further comprising, after said causing the converting material of the first converting portion to chemically react and said causing the converting material of the second converting portion to chemically react are performed, forming interconnect layers on the gate electrode region, wherein the gate electrode region is disposed between and in direct physical contact with the gate dielectric region and the interconnect layers.

* * * * *